US008392056B1

(12) United States Patent
Dahl et al.

(10) Patent No.: US 8,392,056 B1
(45) Date of Patent: Mar. 5, 2013

(54) DIAGNOSTIC CONNECTOR ASSEMBLY (DCA) INTERFACE UNIT (DIU)

(75) Inventors: Miles Dahl, Spicewood, TX (US); Richard G. Dickson, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 137 days.

(21) Appl. No.: 12/800,882

(22) Filed: May 25, 2010

Related U.S. Application Data

(63) Continuation of application No. 12/660,212, filed on Feb. 23, 2010, now abandoned.

(60) Provisional application No. 61/154,588, filed on Feb. 23, 2009.

(51) Int. Cl.
*G01M 17/007* (2006.01)
*H03M 1/00* (2006.01)
*G06F 3/00* (2006.01)
*G06F 13/00* (2006.01)

(52) U.S. Cl. .......................... 701/31.5; 710/69; 341/155

(58) Field of Classification Search ............. 701/29–35, 701/33.2, 33.3, 31.5
See application file for complete search history.

(56) References Cited

U.S. PATENT DOCUMENTS

| | | | | | |
|---|---|---|---|---|---|
| 4,258,421 | A | * | 3/1981 | Juhasz et al. | 701/33.2 |
| 4,853,850 | A | | 8/1989 | Krass, Jr. et al. | |
| 4,926,330 | A | * | 5/1990 | Abe et al. | 701/34.4 |
| 5,318,449 | A | * | 6/1994 | Schoell et al. | 434/305 |
| 5,726,984 | A | * | 3/1998 | Kubler et al. | 370/349 |
| 5,850,209 | A | * | 12/1998 | Lemke et al. | 345/156 |
| 5,884,202 | A | * | 3/1999 | Arjomand | 701/29 |
| 5,916,287 | A | * | 6/1999 | Arjomand et al. | 701/33.2 |
| 5,937,368 | A | * | 8/1999 | Hall et al. | 702/123 |
| 6,263,268 | B1 | * | 7/2001 | Nathanson | 701/31.5 |
| 6,356,823 | B1 | * | 3/2002 | Iannotti et al. | 701/35 |
| 6,538,472 | B1 | * | 3/2003 | McGee | 326/82 |
| 6,636,789 | B2 | * | 10/2003 | Bird et al. | 701/33.4 |
| 6,693,367 | B1 | * | 2/2004 | Schmeisser et al. | 307/9.1 |
| 6,772,248 | B1 | | 8/2004 | McClure et al. | |
| 7,337,245 | B2 | | 2/2008 | McClure et al. | |
| 7,778,750 | B2 | * | 8/2010 | Knight et al. | 701/31.5 |
| 7,786,851 | B2 | * | 8/2010 | Drew et al. | 340/438 |
| 7,821,439 | B2 | * | 10/2010 | Replogle et al. | 341/152 |
| 8,010,249 | B2 | * | 8/2011 | Liebl et al. | 701/31.5 |
| 2003/0158640 | A1 | * | 8/2003 | Pillar et al. | 701/33 |
| 2006/0025894 | A1 | * | 2/2006 | O'Connor et al. | 701/1 |
| 2009/0027229 | A1 | * | 1/2009 | Fortson et al. | 340/870.07 |
| 2010/0204878 | A1 | * | 8/2010 | Drew et al. | 701/33 |
| 2010/0217479 | A1 | * | 8/2010 | Dahl et al. | 701/33 |
| 2012/0226408 | A1 | * | 9/2012 | Miller et al. | 701/31.5 |

OTHER PUBLICATIONS

P.J. Jonsson, Paladin's prognostic/diagnostic interface unit (P/DIU) enhancement effort, Technology Conference, Aug. 20-23, 2001, 584-592.
Filing Receipt for U.S. Appl. No. 12/660,204, filed Feb. 23, 2010.
Filing Receipt for U.S. Appl. No. 12/660,256, filed Feb. 23, 2010.
Filing Receipt for U.S. Appl. No. 12/660,205, filed Feb. 23, 2010.
Filing Receipt for U.S. Appl. No. 12/660,209, filed Feb. 23, 2010.
Filing Receipt for U.S. Appl. No. 12/660,248, filed Feb. 23, 2010.

* cited by examiner

*Primary Examiner* — Mark Hellner
*Assistant Examiner* — Ari M Diacou
(74) *Attorney, Agent, or Firm* — Robert K. Tendler; Daniel J. Long

(57) ABSTRACT

In a diagnostics system for use on vehicles, wherein the improvement comprises a connector assembly that translates diagnostic connector assembly signals into a digital format suitable for computer based analysis and fault diagnosis on an individual vehicle and vehicle fleet basis.

15 Claims, 3 Drawing Sheets

DIAGNOSTIC CONNECTOR ASSEMBLY (DCA) INTERFACE UNIT (DIU)

RELATED APPLICATIONS

This is a continuation of patent application Ser. No. 12/660,212 filed Feb. 23, 2010 now abandoned entitled Diagnostic Connector Assembly (DCA) Interface Unit (DIU) and claims rights under 35 USC §119(e) from U.S. Application Ser. No. 61/154,588 filed Feb. 23, 2009, the contents of which are incorporated herein by reference.

FIELD OF THE INVENTION

The present invention relates to embedded vehicle diagnostic systems and more particularly to interface units supporting embedded diagnostics for existing analog diagnostic connector assemblies.

BACKGROUND OF THE INVENTION

In the past, diagnostic connector assemblies (DCAs) have been built into legacy military vehicles typically for associated analog sensor measurements from the engine or transmission. These diagnostic connectors were used in conjunction with specialized test equipment, in which the test equipment was typically brought out to a vehicle after a problem was encountered. When not in use, the diagnostic connector assembly is protected by a dust cover. This concept of operation does not provide constant, real time monitoring because the test equipment had to be moved up to a vehicle each time testing was required. This increases the logistical footprint because of added test equipment for maintainer to bring forward, as well as test equipment to be maintained over the extended life cycle of the platform. Significantly, the special test equipment used in the past was only effective after a failure because on board vehicle health was not continually monitored.

A significant number of about 200,000 or more of the older legacy military vehicle fleet have analog diagnostic connector assembly connectors for troubleshooting older engines and transmissions. Use of these connectors in troubleshooting requires specialized test equipment and experienced personnel provided with detailed technical instructions. Support of the specialized test equipment and personnel training increases cost of the support function and increased the logistics footprint.

Condition Based Maintenance (CBM+) concepts are now regularly deployed that require digitally formatted data for vehicle and fleet health monitoring and fault isolation, and that there is a desire and need to lower legacy vehicle total ownership costs.

By way of further background, for older analog military vehicles it was important to be able to perform diagnostic testing on their combustion engines and transmissions. In order to do this these vehicles were provided with a diagnostic connector assembly which was simply a connector to connect analog signals on a vehicle bus to test equipment that was pulled up to perform the diagnostic function. It is noted that in these legacy vehicles there was nothing embedded in the vehicle to support diagnostics.

Moreover, the future requires taking advantage of signals and pin outs in which signals that are measured are measured for both the combustion engine and the transmission. It is therefore important that a diagnostic interface unit apply a new technology mount to the diagnostic connector assembly and the vehicle, stay on the vehicle and therefore be embedded, and provide a microprocessor such that diagnostic inferences can be made with respect to the vehicle. Additionally, it would be important that diagnostic expertise be installed within the module, with the programming providing the module with an understanding of the phenomenology associated with for instance, both the engine and the transmission, thus to be able to develop diagnostic conclusions for detection and isolation of faults; and to be able to do this at the vehicle.

A need exists, therefore, for a diagnostic connector assembly interface unit that avoids the above disadvantages and allows for digitally formatted data for vehicle and fleet maintenance and lower legacy vehicle total ownership costs.

Note, telenostic systems are described in the following U.S. patent applications, filed on even date herewith, assigned to the assignee hereof and incorporated herein by reference: Ser. No. 12/660,204 In Service Support Center and Method of Operation, Ser. No. 12/660,256 Telenostics, Ser. No. 12/660,205 Portable Performance Support Device and Method for Use, Ser. No. 12/660,209 Telenostics Performance Logic, and Ser. No. 12/660,248 Telenostics Certify.

SUMMARY OF INVENTION

In order to solve the above problems a low cost connector assembly or module is provided that translates the analog diagnostic connector assembly signals into a digital format suitable for computer based analysis and fault diagnosis on an individual vehicle and on a vehicle fleet basis. The module discussed above is referred to herein as a diagnostic interface unit or DIU.

The subject diagnostic interface unit in one embodiment can take the output of a legacy diagnostic connector assembly and modify it or interface it. In another embodiment, it is the purpose of the diagnostic interface unit to interface to the older vehicles that have only the diagnostic connector and provide an embedded diagnostics capability where none had previously been embedded in the vehicle.

In the embodiments to be described the diagnostic interface unit plugs into the analog connectors used on legacy vehicles that were not part of a modernization exercise which would have involved an embedded diagnostic controller, embedded along with the engine and transmission, but was connected to or plugged into a bigger diagnostic system.

It will be appreciated that what is unique about providing the subject diagnostic interface unit is that the unit itself is uploaded with diagnostic knowledge and programming of what is required to be done in order to perform the diagnostics, for instance for both engines and transmissions; and then to understand the specific signal measurement requirements to perform the diagnostic tests on these vehicles.

What is unique to the subject diagnostic interface unit is a combination of technology that ascertains or knows what one is to measure, the signal conditions that are to be measured as well as the signal parameters, all in conjunction with diagnostics expertise. This then permits the diagnostic interface unit to take advantage of the signals that are offered and to make useful diagnostic conclusions.

It is noted that all previous diagnostics were accomplished off board with external test equipment. This test equipment had to be plugged into the legacy connectors and were not embedded or on-board.

It will be appreciated that until the subject invention, no device could be hooked up and stay resident and permanently attached to a vehicle connector so that the processing is in fact resident on board the vehicle to provide the diagnostics, with the results brought out to crew or maintainers at the vehicle.

Thus, the subject system provides simple universal interface diagnostic conclusions similar to those available using older external diagnostic test equipment. Moreover, the subject interface provides a new level of diagnostics, more accurate levels of diagnosis and provides information roll up that is different that which was provided by the old pieces of test equipment.

It is also important that the subject interface unit permit transmission of the relevant information to the available crew on the platform or maintainers at the platform. To this end, the subject diagnostic interface unit is provided with connectivity to on board computers in the vehicle, either a mission computer or a dedicated platform diagnostic computer with or without in-vehicle display. Moreover, the subject diagnostic interface unit achieves connectivity to new or existing pieces of test equipment that maintainers that go to the vehicle have available. These include such devices as portable maintenance aids (PMA) or maintenance support devices (MSDs).

Thus, the subject diagnostic interface unit can be connected to a diagnostic or mission computer that is resident on the vehicle or could be connected to an externally-provided portable maintenance aid or a maintenance support device laptop.

In one embodiment the diagnostic interface unit has very specific signal conditioning circuits to address the types of signals that one is measuring. This includes the types of voltages that may be required to be measured, especially by certain types of bridge circuits that are typically in transducers coupled to the vehicle. In short, the diagnostic interface unit addresses analog-level signals. Thus, the diagnostic interface units are very specific and sensitive to the type of information that is to be captured. In one embodiment, the diagnostic interface units also include filter circuits and diode detector circuits that perform sampling, signal conditioning and sometimes provide diagnostic test stimulus in order to perform the diagnostic tests required.

The diagnostic interface unit in one embodiment includes multiplexers for multiplexing the detected information and amplifiers to amplify the detected signals to appropriate levels.

Moreover, the diagnostic interface unit is provided with analog-to-digital conversion circuits that are coupled to a digital signal processor, with the powering for the diagnostic interface unit being provided by a power supply which often as not is filtered.

The system therefore connects to the dedicated analog connector that has existed for perhaps the last 30 years, stays connected in tactical operation and provides a device for digitizing the analog signals available from legacy vehicles, and also to provide embedded diagnostic capabilities where there were none.

In summary, a diagnostic interface unit is provided with intelligence and is adaptable for servicing not only legacy vehicles with legacy diagnostic connector assemblies, but also is programmable for use with vehicles that have diagnostic capabilities that exceed that provided on the legacy vehicles.

BRIEF DESCRIPTION OF THE DRAWINGS

These and other features of the subject invention will be better understood in connection with the Detailed Description, in conjunction with the Drawings, of which.

DETAILED DESCRIPTION

Figure 1:
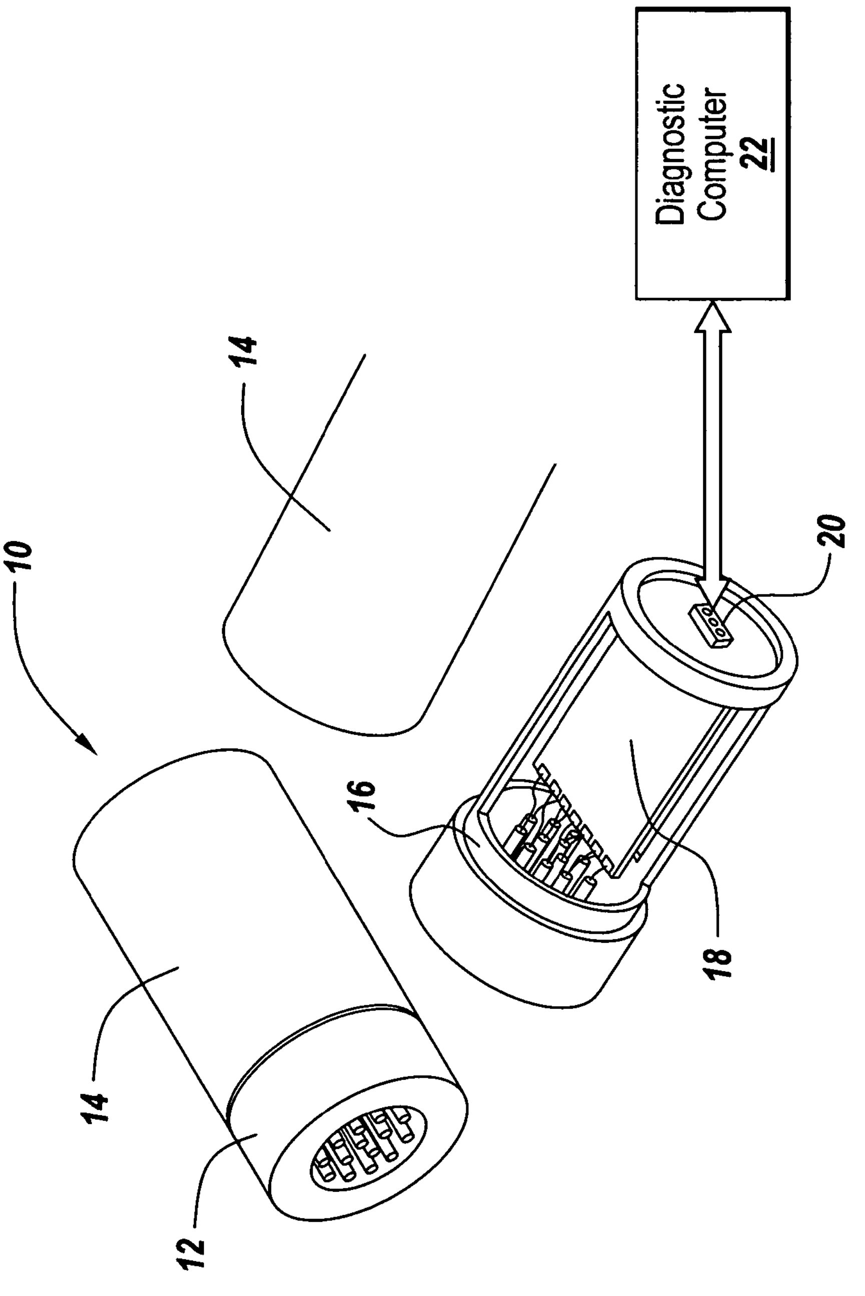
FIG. 1 is a diagrammatic illustration of a diagnostic interface unit made to be resident at a vehicle.

Referring to FIG. 1, a diagnostic connector assembly in the form of a diagnostic interface unit 10 eliminates the need for special test equipment while providing constant, real time monitoring. Diagnostic interface unit 10 includes a vehicle connector assembly 12 at one end of an outer cylindrical housing 14. Housing 14 slips over an inner cylindrical housing 16 that is apertured to expose a printed circuit board assembly 18 having contact pads connected to the connectors of connector assembly 12. An RS-422 or like connector 20 is used to connect the output of board 18 to a diagnostic computer 22.

The diagnostic interface unit approximates a modern engine sensing unit, and is adapted to be permanently installed on vehicles to provide constant engine status that allows health and status awareness, as well as, interactive diagnostics and prognostics. The diagnostic interface unit provides an analog interface with signal conditioning and switching, a digitizer with an analog-to-digital converter, a processor, and an industry standard SAE J1939 output at connector 20.

In one embodiment, the diagnostic connector assembly diagnostic interface unit has the ability to sample, convert and transmit 16 signals. Software algorithms, hosted on a portable maintenance aid or sensor interface unit shown representationally by diagnostic computer 22, allow interactive diagnostics for dynamic conditions. As will be appreciated, the diagnostic interface unit enables the Condition Based Maintenance (CBM) desired by the military.

Figure 2:
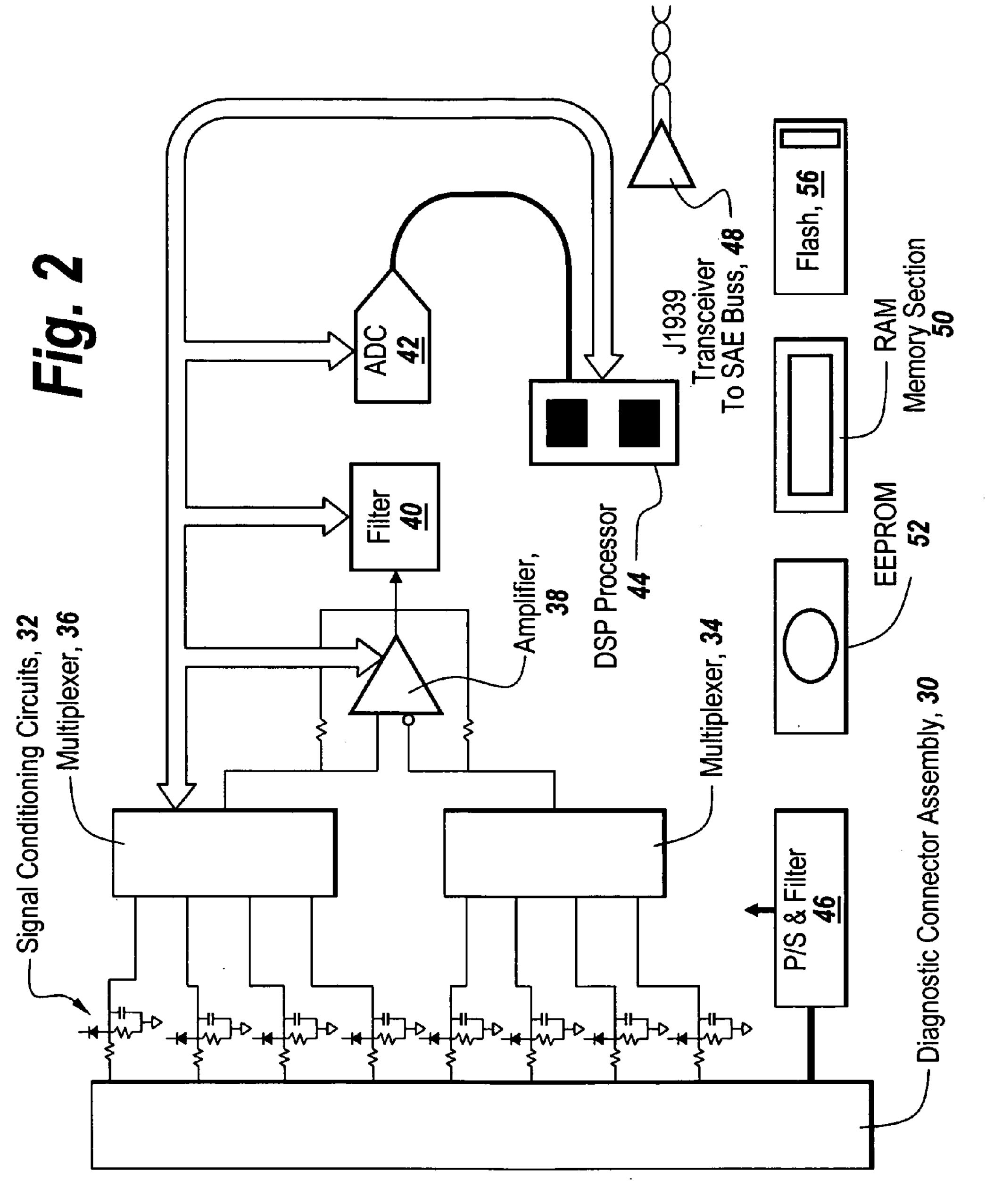
FIG. 2 is a schematic component view of a preferred embodiment of the present invention.

Referring now to FIG. 2, a component view of the subject interface is shown in which among other advantages features a digital signal processing chip used with a flash memory.

Here it can be seen that diagnostic interface unit 10 includes a diagnostic connector assembly 30 to which are coupled signal conditioning circuits 32, the outputs of which are coupled to respective multiplexers 34 and 36. The multiplexers are coupled to the inverting and non-inverting inputs of an amplifier 38 having its output coupled to a filter 40 and thence to an analog-to-digital converter 42. The output of the analog-to-digital converter is coupled to a DSP processor 44. A power supply and filter 46 has its output applied to the appropriate circuits requiring filtered power; and the output from DSP processor 44 may be either coupled over a transceiver to a bus J1939 bus 48, or CAN, with the processor's output available from the processors' memory section 50 that may constitute an EEPROM 52, a RAM 54 or a flash drive unit 56.

It is the purpose of the diagnostic interface unit to provide an analog interface to the analog signals on the vehicle bus and to condition and switch them utilizing a digitizer coupled to an analog-to-digital converter and a processor, with the processor housing the diagnostic tools or software to provide a smart interface.

Figure 3:
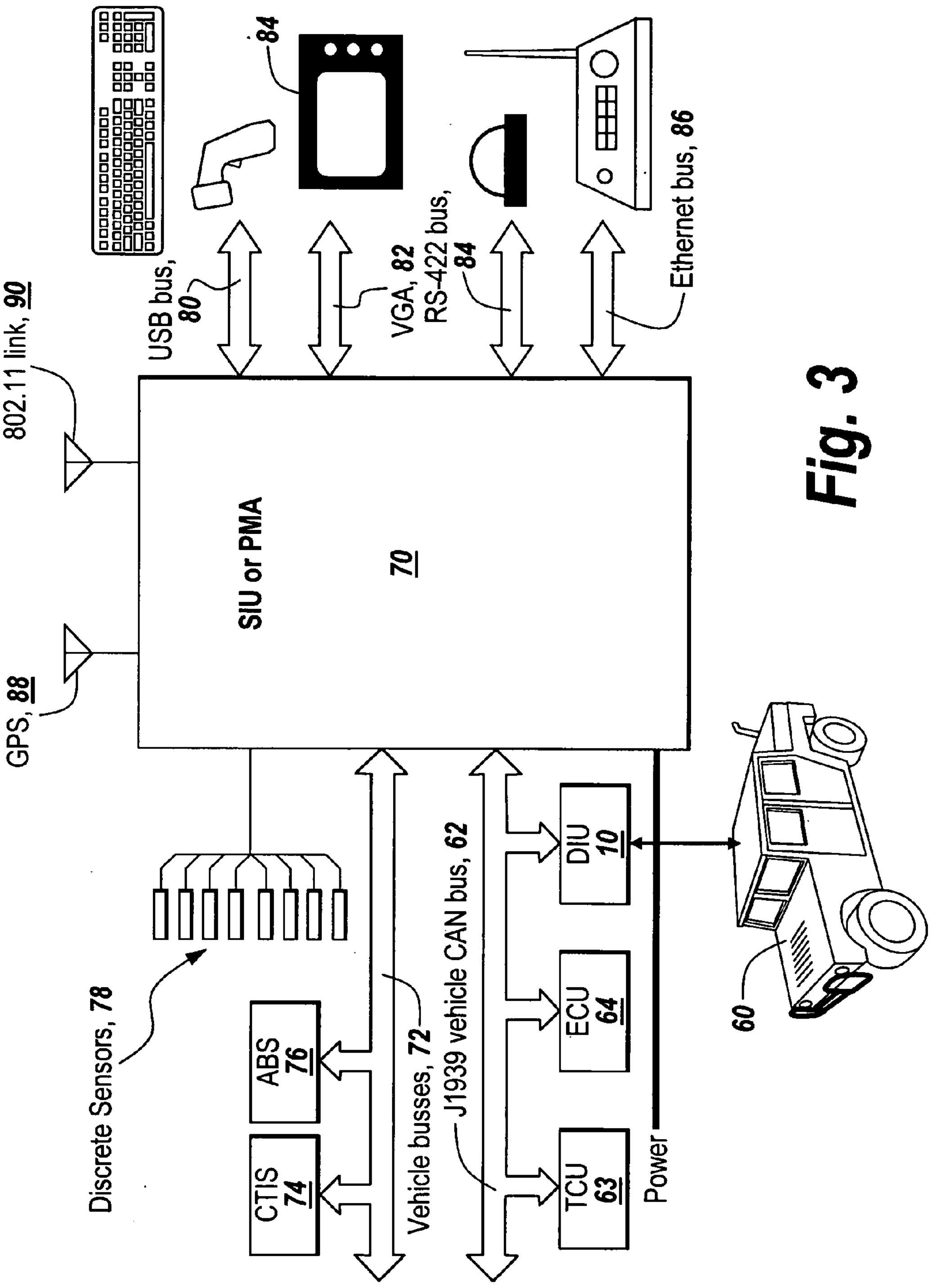
FIG. 3 is a schematic system view of a preferred embodiment of the diagnostic interface unit of the present invention.

Referring to FIG. 3, the diagnostic interface unit is shown as part of a larger system in which the diagnostic interface unit is one of several devices aboard a vehicle. Here diagnostic interface unit 10 is coupled to the analog connector on a vehicle 60, with the output of the diagnostic interface unit being coupled to a J1939 CAN bus, here shown at 62. Also coupled to this bus is a transmission control unit (TCU) 63 and an engine control unit ECU or engineering control unit 64.

Bus 62 is coupled to a processing module 70 which may contain either a portable maintenance aid (PMA) or a sensor interface unit (SIU).

In one embodiment a vehicle J1708 bus, is coupled to a central tire inflation system (CTIS) module 74 along with being coupled to an automatic braking system (ABS) module 76.

Discrete sensors 78 are also coupled directly to a processing module 70.

The output of processing module 70 is available on a USB bus 80, a VGA bus 82 to a monitor 84, an RS-422 bus 84 and an Ethernet bus 86, here specified as a Gig-E x 2 bus. The components shown in FIG. 3 thus constitute a larger embedded diagnostic system that for instance has a GPS input at 88 and supports an 802.11 link 90.

As can be seen, rather than having all the diagnostics performed by off-board external test equipment, in the subject invention the diagnostic interface unit permits on-board diagnostics resident on a vehicle.

The subject system provides similar diagnostic conclusions to those provided by older external diagnostic test equipment, but in addition provides new levels of diagnostics, more accurate levels of diagnostics and information rollup that is different from that available from external pieces of test equipment.

Note, the output of the subject diagnostic interface unit may potentially either be another computer on-board the vehicle, be it a mission computer or a dedicated platform diagnostic computer, or may be interfaced to external diagnostic equipment.

In either case, the results of the diagnostics are immediately available to maintainers at the vehicle through displays driven by the diagnostic interface unit, such as available from portable maintenance aids or maintenance port devices. Note that the portable maintenance aids or maintenance support devices are names given to laptops that are available to maintainers in the Army or the Marines which are brought up to the vehicles that are in for diagnosis and repair.

It will be appreciated that as shown in FIG. 2 there is very specific signal conditioning of the signals available at the input to the diagnostic connector assembly. These diagnostic connector assemblies are designed with knowledge of the types of signals that one is measuring, the types of voltages that may be required, the types of bridge circuits that are typically in transducers and the nature of the analog levels of signals that are expected for the particular vehicle.

The RC circuits and diode detectors provide sampling, signal conditioning and sometimes provide stimulus for diagnostic testing of the vehicle.

Note that the use of multiplexers enables processing of multiplexed data streams such that more than one condition can be monitored at one time. The signals can be further conditioned through amplification and filtering as described above, with the conditioned signals applied to a digital-to-analog converter and then to a digital signal processor into which is loaded the diagnostic algorithms employed for monitoring the particular vehicle or the particular fleet of vehicles.

It is noted that the J1939 vehicle CAN bus is typically available to aid in connecting diagnostic computers or electronic control modules that provide control and diagnostics, for instance for an automatic brake system or an engine or transmission. Here the J1939 CAN bus provides the digital backbone that can be dedicated to support control or diagnostics.

In summary, what is provided for dedicated analog connectors that have existed on vehicles for the past 30 years is an interface unit to digitize these signals and provide embedded diagnostic capabilities where heretofore there was none.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method for providing diagnostic capabilities to legacy vehicles having analog connector assemblies that output analog signals relating to vehicle health, comprising the steps of:

providing a hand-holdable universal diagnostic interface unit having a connector on one end of the diagnostic interface unit adapted to directly mate with an existing analog connector on the vehicle and a connector at the other end of the diagnostic interface unit to output digital data, the universal diagnostic interface unit adapted to be directly attached to the existing analog connector on the vehicle, so as to connect to the analog connector without using a connector cable;

directly attaching the diagnostic interface unit to the existing analog connector assembly without using a connector cable by using the connector at the one end of the unit, the diagnostic interface unit carrying specialized signal conditioning circuits, a processor and a digital-to-analog converter coupled to the processor;

providing the processor with algorithms to be able to diagnose and prognosticate present and future problems relative to the vehicle and to provide an output of the diagnosis or prognosis information; and, providing the output from the processor through the connector at the other end of the diagnostic interface unit.

2. The method of claim 1, wherein the signal conditioning circuits include multiplexer circuits to enable the processor to simultaneously process multiple signals.

3. The method of claim 1, and further including coupling the output of the processor to on-board diagnostic equipment.

4. The method of claim 3, and further including coupling the output of the processor to an off-board diagnostic computer.

5. Apparatus for the detecting of signals available from a vehicle for use in diagnosis and prognostication, comprising:

an analog connector assembly embedded at said vehicle and adapted to provide signals useful in diagnosis and prognostication related to said vehicle; and, a hand-holdable interface unit having a connector at one end of said unit adapted to be directly attached to said embedded analog connector assembly by directly attaching the connector at said one end of said unit to said embedded analog connector, said diagnostic interface unit carrying signal conditioning circuits, filtering circuits, multiplexing circuits, and an analog-to-digital converter for converting conditioned and multiplexed signals into digital signals, said digital signals being coupled to a processor, said diagnostic interface unit including an output connector assembly at the other end of said diagnostic interface unit adapted to output signals from said processor to diagnostic or prognosticating computers.

6. The apparatus of claim 5, wherein said diagnostic or prognosticating computers are embedded in said vehicle.

7. The apparatus of claim 5, wherein said diagnostic or prognosticating computers are external to said vehicle.

8. The apparatus of claim 5, wherein said vehicle includes a bus and wherein said diagnostic interface unit is coupled to said bus by the direct attachment of said embedded analog connector to said connector at said one end of said diagnostic interface unit.

9. The apparatus of claim 8, wherein said bus is adapted to be coupled to a processing module.

10. The apparatus of claim 9, wherein said processing module includes one of a sensor interface unit and a portable maintenance aid.

11. The apparatus of claim 8, and further including at least one of a electronic control unit and transmission control unit coupled to said bus.

12. The apparatus of claim 9, and further including a vehicle bus coupled to said processing module and further including at least one of a central tire inflation module and automatic braking module coupled to said vehicle bus.

13. The apparatus of claim 12, and further including a discrete sensor coupled to said processing module.

14. The apparatus of claim 9, and further including a GPS receiver coupled to said processing module.

15. The apparatus of claim 9, and wherein said processing module supports at least one of an 802.11 communications network, a USB bus, a VGA bus, an RS-422 bus and an ethernet bus.

* * * * *